(12) United States Patent
Kumano et al.

(10) Patent No.: US 8,344,264 B2
(45) Date of Patent: Jan. 1, 2013

(54) SEMICONDUCTOR DEVICE AND MANUFACTURING PROCESS THEREOF

(75) Inventors: Yutaka Kumano, Hyogo (JP); Hideki Iwaki, Osaka (JP); Tetsuyoshi Ogura, Osaka (JP); Shingo Komatsu, Osaka (JP); Koichi Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 663 days.

(21) Appl. No.: 12/489,818

(22) Filed: Jun. 23, 2009

(65) Prior Publication Data
US 2009/0321124 A1   Dec. 31, 2009

(30) Foreign Application Priority Data

Jun. 25, 2008 (JP) ................................. 2008-165425

(51) Int. Cl.
*H05K 1/11* (2006.01)
(52) U.S. Cl. ......................... 174/261; 174/262; 257/780
(58) Field of Classification Search .......... 174/261–266; 257/780–781; 439/65–75
See application file for complete search history.

(56) References Cited

U.S. PATENT DOCUMENTS

| 5,309,324 A * | 5/1994 | Herandez et al. | 361/734 |
| 6,265,673 B1 * | 7/2001 | Higashida et al. | 174/260 |
| 6,613,979 B1 * | 9/2003 | Miller et al. | 174/541 |

FOREIGN PATENT DOCUMENTS

JP   2003-152133   5/2003

* cited by examiner

*Primary Examiner* — Jeremy Norris
(74) *Attorney, Agent, or Firm* — McDermott Will & Emery LLP

(57) ABSTRACT

A pair of discretionary points on a principal surface of a block are coupled to each other with a metal wire having a length larger than a distance between the pair of discretionary points, liquid resin is applied to the principal surface so as to cover the metal wire and then cured, so that a resin-cured material is formed, and the upper-surface portion of the resin-cured material is removed together with an intermediate portion of the metal wire, and then the block is removed from the resin-cured material.

7 Claims, 9 Drawing Sheets

SEMICONDUCTOR DEVICE AND MANUFACTURING PROCESS THEREOF

BACKGROUND OF THE INVENTION

1. Field of the Invention

The present invention relates to a structure of a substrate mostly used in an interposer of a semiconductor device and a process for manufacturing the substrate.

2. Description of the Related Art

In recent years, a semiconductor chip is increasingly miniaturized. Along with the miniaturization is increasingly adopted, in view of a cost efficiency, a mounting structure wherein, first, a semiconductor device is mounted on an interposer substrate which fills in a connection pitch difference between a mother board having a relatively low mounting density and a semiconductor chip to obtain a CSP (chip size package) and the CSP is then mounted on the mother board.

A build-up substrate was so far frequently used as the interposer substrate. As the technology has advanced in recent years, line/space pitches of wiring in the build-up substrate have reduced to such a fine dimension as approximately 10 microns; however, pitches of vias provided for connection in a thickness direction of the substrate are 100 microns at the very most. This is a serious bottleneck in the miniaturization of an interposer substrate.

Therefore, novel interposer substrates, which are not bound by the conventional concept of a build-up substrate, start being devised, as exemplified by those recited in No. 2003-152133 of the Japanese Patent Applications Laid-Open (hereinafter, referred to as conventional example 1). The conventional example 1 discloses an interposer substrate 200 in which wires are used. An outline of the interposer substrate 200 is described referring to FIG. 9. The interpose substrate 200 comprises a double-surfaced wiring board 100 and an insulation resin layer 141. In the double-surfaced wiring board 100, a land 121 and a terminal 122 for solder bump are electrically connected to each other through a via hole 131. The insulation resin layer 141 is formed on the double-surfaced wiring board 100. An electrical conduction lead 151a is extended from the land 121 in the insulation resin layer 141 toward a surface of the insulation resin layer 141. A connection terminal 151b is formed at the distal end of the electrical conduction lead 151a.

An example of a manufacturing process of the interposer substrate 200 is described below. A double-surfaced wiring board 100, wherein the land 121 and the terminal 122 for solder bump are formed on both surfaces of an insulation substrate 111, is prepared. A wire 151a is extended from the land 121 of the double-surfaced wiring board 100 at a predetermined angle, and an insulation resin layer 141 is then formed. After the formation of the insulation resin layer 141, the wire 151a present on a surface of the insulation resin layer 141 is cut away, and the surface is polished. As a result, an interposer substrate (substrate for semiconductor package) 200, wherein the electrical conduction lead 151a is formed in the insulation resin layer 141 and the connection terminal 151b is formed on the surface of the insulation resin layer 141, is obtained.

In the conventional example 1 wherein the double-surfaced wiring board 100 is used, however, an inter-land interval is approximately 300 microns at the very most, which fails to meet the level of the miniaturization currently demanded. The conventional example 1 is further disadvantageous in that any effective measures for heat release and denoising, which are requirements of an interposer substrate in addition to miniaturization, have not been adopted.

SUMMARY OF THE INVENTION

Therefore, a main object of the present invention is to provide a fine-pitched interposer substrate.

In order to accomplish the object, an interposer substrate manufacturing process according to the present invention comprises:

a first step in which a pair of discretionary points on a principal surface of a block are coupled to each other with a metal wire having a length larger than a distance between the pair of discretionary points;

a second step in which liquid resin is applied to the principal surface so as to cover the metal wire and then cured, so that a resin-cured material is obtained;

a third step in which the upper-surface portion of the resin-cured material is removed together with an intermediate portion of the metal wire; and a fourth step in which the block is removed from the resin-cured material.

In the interposer substrate obtained by the process according to the present invention, since the metal wire is provided so as to penetrate the resin-cured material in its thickness direction, an end of the metal wire can be used as a connection electrode for connecting a semiconductor device thereto, while the other end thereof can be used as a land electrode for connecting a mother board thereto. A diameter of the metal wire is such an extremely small dimension as approximately 12-25 microns. Therefore, the interposer substrate obtained by the present invention is far more fine-pitched than a conventional interposer substrate.

According to a preferable mode of the present invention, the interposer substrate manufacturing process further comprises a fifth step in which a projection, at least the surface of which is made of metal, is formed on the principal surface of the block prior to the first step, wherein one of the pair of discretionary points is set on the principal surface and the other is set on the upper surface of the projection in the first step, the upper-surface portion of the resin-cured material is removed to such an extent that the projection is exposed in the third step, and the block excluding the projection is removed from the resin-cured material in the fourth step.

Accordingly, the projection can be used as a heat-release path for releasing heat generated in the semiconductor device, so that a temperature of the semiconductor device can be lowered. Moreover, when the projection is used as a ground, a stable reference electrode can be obtained, which stabilizes electric characteristics, while a stable potential can be obtained when the projection is used as a power supply.

According to another preferable mode of the present invention, the interposer substrate manufacturing process further comprises a fifth step in which a projection which is provided with a step portion and at least the surface of which is made of metal is formed on the principal surface of the block prior to the first step, wherein one of the pair of discretionary points is set on the uppermost surface of the projection and the other is set on the upper surface of the step portion of the projection or the principal surface in the first step, the upper-surface portion of the resin-cured material is removed to such an extent that the projection is exposed in the third step, and the block excluding the projection is removed from the resin-cured material in the fourth step.

Accordingly, ground terminals or power-supply terminals of the semiconductor device can be intensively provided on the projection, and the number of pins can be thereby reduced.

According to still another preferable mode of the present invention, a pair of the projections are formed on the principal surface so as to be as close to each other as possible in the fifth step, and the pair of discretionary points are coupled to each other with the metal wire, and the gap between the pair of the projections is filled with a dielectric member in the first step. Accordingly, one of the projections can be used as a ground, while the other projection can be used as a power supply. Further, by filling the gap between the two projections with the dielectric member, a bypass capacitor (also called a decoupling capacitor) can be formed. As a result, noises can be reduced. As an alternative constitution, a chip-type electronic component (for example, chip capacitor) may be mounted between the two projections. Thus constituted, a similar effect can be obtained.

According to still another preferable mode of the present invention, the interposer substrate manufacturing process further comprises a sixth step in which electrodes connected to the metal wire are formed on the surface of the resin-cured material after the fourth step.

Accordingly, the electrodes can be properly formed and ligned, which improves mountability. In the case where gold or aluminum is used as a material of the metal wire, the used metallic material may seep into the melted solder. This problem, however, can be solved when the electrodes are made of barrier metal (Cr, Ni or the like) by electroless plating.

According to the present invention, the following effects can be obtained.

A fine-pitched interposer substrate can be obtained. Though various pitches can be considered as a fine pitch, a fine pitch here means approximately 12-25 microns.

The connection electrode for connecting the semiconductor device and the land electrode for connecting the mother board can be connected to each other with a shortest distance therebetween.

An interposer substrate whose ground potential is stabilized can be obtained.

An interposer substrate superior in heat releasability can be obtained.

A dielectric member can be easily provided in the interposer substrate, and the interposer substrate provided with the dielectric member can achieve superior noise characteristics.

According to the present invention, an interposer substrate which is far more fine-pitched than any conventional interposer substrate can be obtained. Moreover, an interposer substrate superior in heat releasability and electric characteristics can be obtained.

BRIEF DESCRIPTION OF THE DRAWINGS

These and other objects of the invention will become clear by the following description of preferred embodiments of the invention and be specified in the claims attached hereto. A number of benefits not recited in this specification will come to the attention of the skilled in the art upon the implementation of the present invention.

DETAILED DESCRIPTION OF THE INVENTION

Preferred Embodiment 1

Figure 1A:
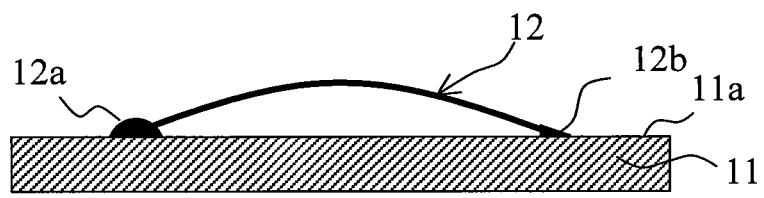
FIGS. 1A-1E are sectional views respectively illustrating an interposer substrate manufacturing process according to a preferred embodiment 1 of the present invention.
Figure 1B:
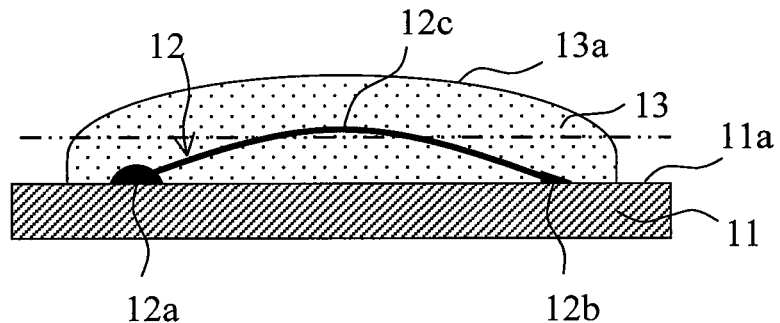
Figure 1C:
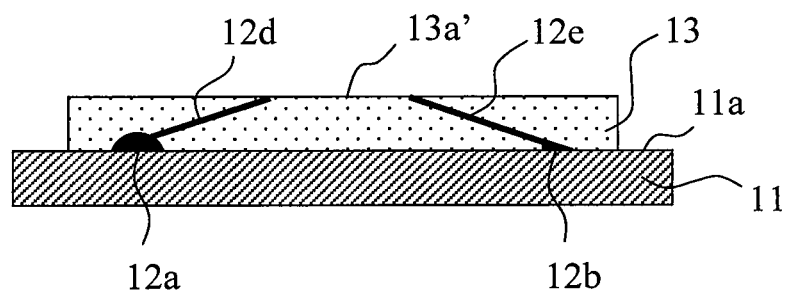
Figure 1D:
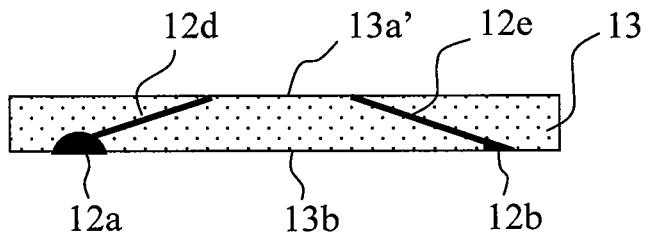

Hereinafter, a preferred embodiment 1 of the present invention is described referring to FIGS. 1A-1E. First, a thin metal plate 11, which is an example of a block, is prepared.

The metal plate 11 is described below using an aluminum plate (A1) as an example. The metal plate 11 may be made of a different type of metal, or a plate configured such that the periphery of an insulation material is coated with metal or only a part of the insulation material is coated with metal may be used.

Two discretionary points on a principal surface 11a of the metal plate 11 are coupled to each other with a metal wire 12 having a length larger than a distance between the two discretionary points and a bow-like shape or any other curved shape by an all-purpose wire boding device. The metal wire 12 may be an Au wire, an Al wire, a Cu wire or the like. In the present preferred embodiment, an Au wire having the diameter of 12 microns is used. One end of the metal wire 12 has a shape 12a called "ball bond," the other end has a shape 12b called "stitch bond." The metal wire 12 is coupled to the metal plate 11 via these shapes 12a and 12b (see FIG. 1A).

Next, liquid resin (not shown) is applied by a dispenser (not shown) to the principal surface 11a of the metal substrate 11 to such an extent that the metal wire 12 is dipped therein. The liquid resin used here is a material containing epoxy resin as its main ingredient in which silica powder, carbon black and the like are dispersed. In the example illustrated in this description, resin for glob-top is applied; however, a method of the application and physical properties of the applied resin are not particularly limited.

The applied liquid resin is heated, for example, at 150° C. for approximately one hour, so that a resin-cured material 13 is obtained. In the example illustrated in this description, the resin is cured by the heat treatment; however, the irradiation of light and the heat treatment may be combined to cure the resin (see FIG. 1B).

Next, the upper-surface portion of the resin-cured material 13 is polished. More specifically, a SiC sand paper having appropriate particle sizes (not shown) is prepared, and the upper-surface portion of the resin-cured material 13 is thereby polished to be removed so that the upper surface 13a of the resin-cured material 13 will be in parallel with the metal plate 11. In the polishing process, an intermediate portion 12c of the metal wire 12 having a bow-like shape or any other curved shape is removed together with the upper-surface portion of the resin-cured material 13 (see FIG. 1C).

When the intermediate portion 12c of the metal wire 12 is removed, first and second wire portions 12d and 12e at both ends of the metal wire 12 remain in the post-polishing resin-cured material 13. The ball bond shape 12a is located at one end of the second wire portion 12d (at the end portion on the side of the metal plate 11), while the stitch bond shape 12b is located at one end of the second wire portion 12e (at the end portion on the side of the metal plate 11). The other end of the first wire portion 12d is exposed out of a polished surface 13a' of the resin-cured material 13. Likewise, the other end of the second wire portion 12e is exposed out of the polished surface 13a' of the resin-cured material 13. Hereinafter, the polished surface 13a' of the resin-cured material 13 is referred to as one principal surface 13a' of the resin-cured material 13.

Other than the polishing process, a cutting process may be adopted. When the cutting process is adopted, the resin-cured material 13 is cut away together with the intermediate portion 12c of the metal wire 12 by, for example, a diamond cutter so that the polished surface 13a' of the resin-cured material 13 will be in parallel with the metal plate 11.

Then, the metal plate 11 is removed from the resin-cured material 13. Accordingly, the other ends of the first and second wire portions 12d and 12e on the other principal surface 13b of the resin-cured material 13 (the ball bond shape 12a and the stitch bond shape 12b are provided at these other ends) are exposed out of the resin-cured material 13.

In order to facilitate the removal of the metal plate 11, silicon grease is applied in advance to the metal plate 11 except for the sections where the metal wire 12 is bonded. The metal plate 11 is removed by inserting a metal plate having a thickness of approximately 20 microns into the interface between the metal plate 11 and the resin-cured material 13. The metal plate 11 may be polished or cut away to be removed (see FIG. 1D).

Figure 1E:
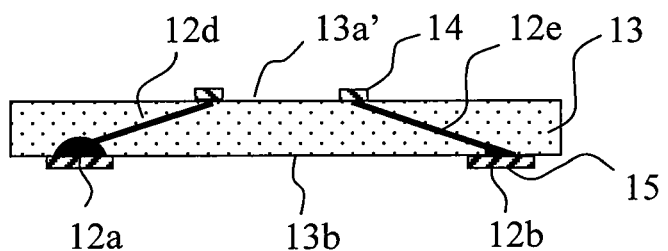

Finally, electrodes 14 and 15 are properly formed and aligned. An example of the formation process is described below. Thin Cu plating is formed on the principal surfaces 13a' and 13b of the resin-cured material 13 by electroless plating, and the Cu plating is thickened by electroplating, so that electrode layers (not shown) are formed. Then, any unnecessary portions in the formed electrode layers are etched to be removed, so that the electrodes 14 and 15 are formed. The formation process can solve the problem that the electrodes are uneven in size or not aligned neatly when the metal wire alone is used. In the case where it is unnecessary for electrodes to be formed or aligned with a very high accuracy, the formation process adopted in this description can be omitted. The interposer substrate thus obtained is illustrated in FIG. 1E. The metal plate electrode 14 serves as a connection electrode for mounting a semiconductor device, while the metal plate electrode 15 serves as a land electrode for mounting a mother board.

Figure 2A:
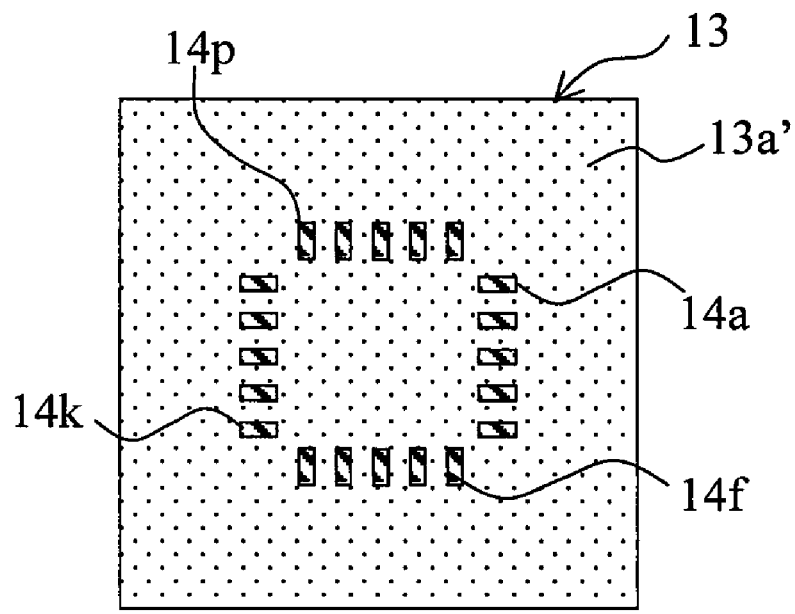
FIG. 2A is a plan view of an interposer substrate manufactured in the manufacturing process according to the preferred embodiment 1.
Figure 2B:
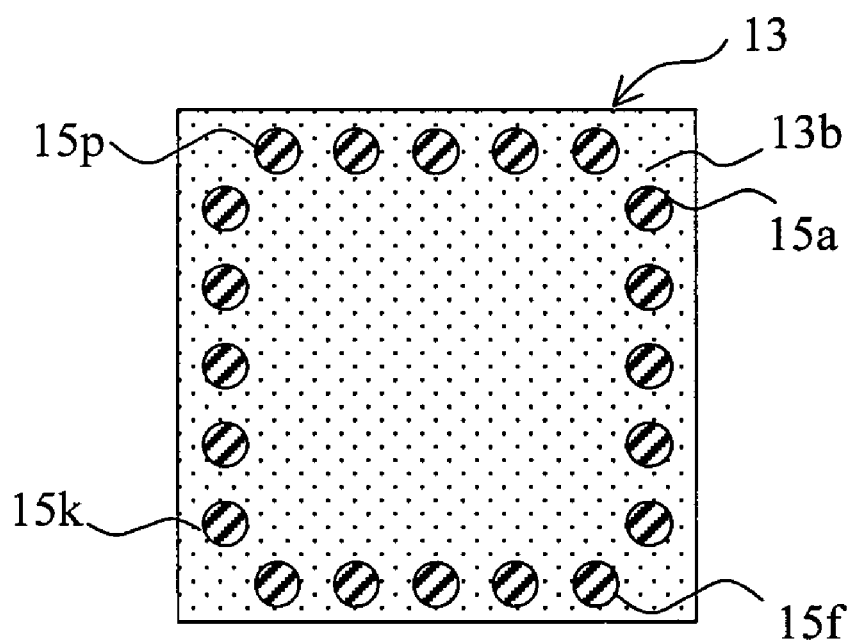
FIG. 2B is a bottom view of the interposer substrate manufactured in the manufacturing process according to the preferred embodiment 1.
Figure 3A:
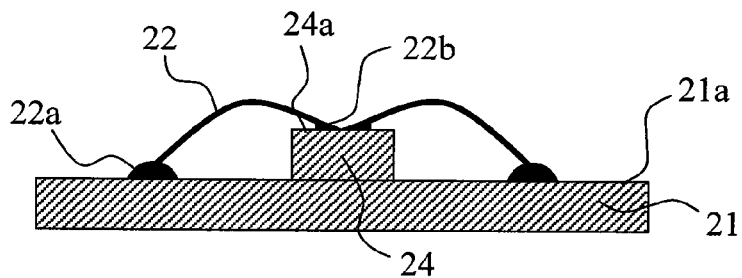
FIGS. 3A-3D are sectional views respectively illustrating an interposer substrate manufacturing process according to a preferred embodiment 2 of the present invention.
Figure 3B:
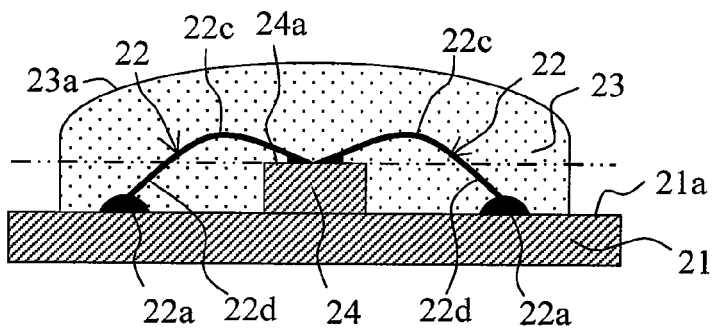
Figure 3C:
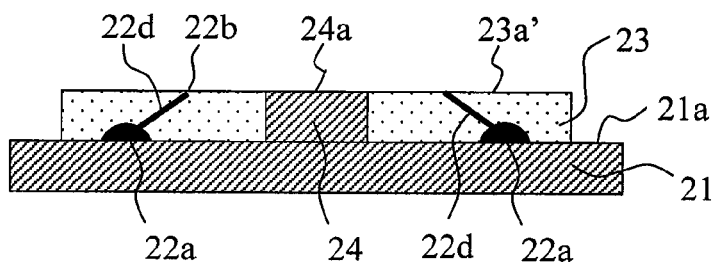
Figure 3D:
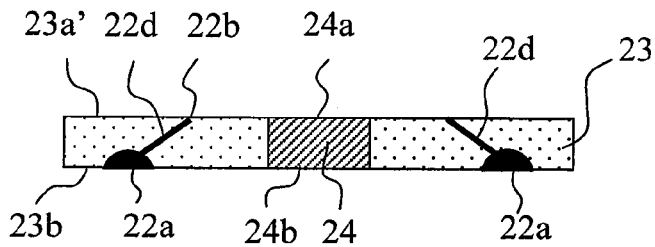
Figure 3E:
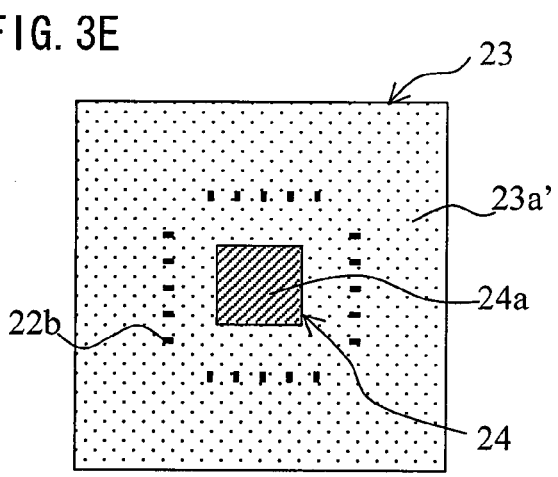
FIG. 3E is a plan view of an interposer substrate manufactured in the manufacturing process according to the preferred embodiment 2.
Figure 3F:
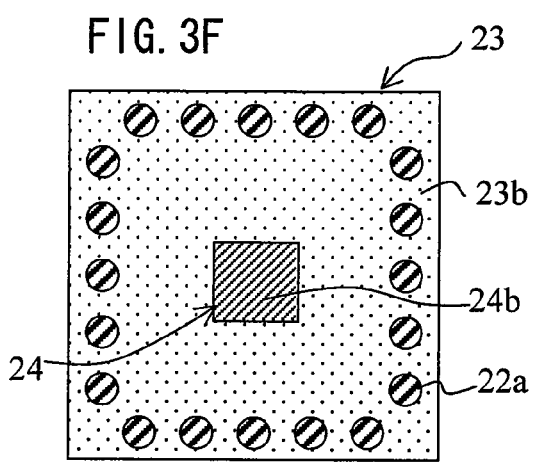
FIG. 3F is a bottom view of the interposer substrate manufactured in the manufacturing process according to the preferred embodiment 2.
Figure 4A:
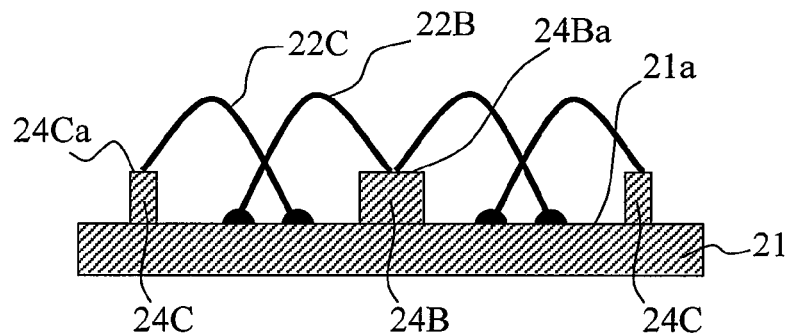
FIGS. 4A-4B are sectional views respectively illustrating an interposer substrate manufacturing process according to a modified embodiment (1) of the preferred embodiment 2.
Figure 4B:
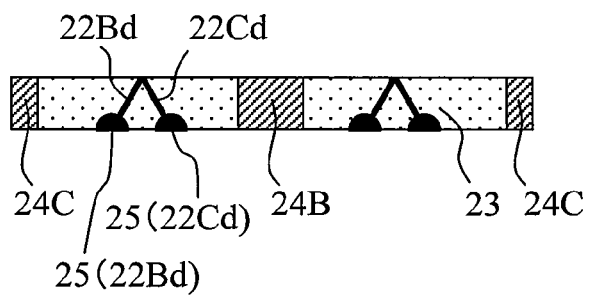
Figure 4C:
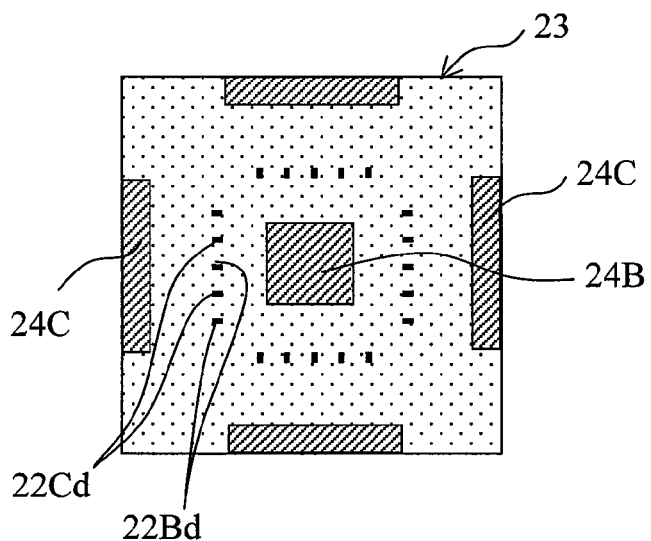
FIG. 4C is a plan view of an interposer substrate manufactured in the manufacturing process according to the modified embodiment (1) of the preferred embodiment 2.
Figure 4D:
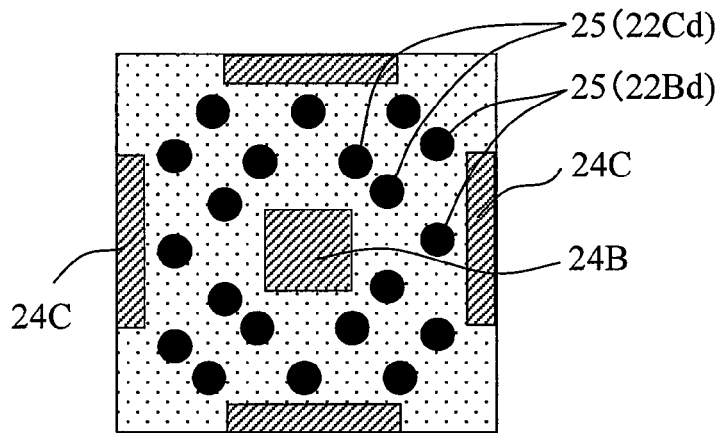
FIG. 4D is a bottom view of the interposer substrate manufactured in the manufacturing process according to the modified embodiment (1) of the preferred embodiment 2.

FIGS. 2A and 2B illustrate the layout of the electrodes viewed from the upper surface and the lower surface of the interposer substrate. In these drawings, a reference symbol 14a (or 15a) is assigned to the metal plate electrode at a right-side upper end of the substrate, and then, reference symbols up to 14t (or 15t) are assigned to the respective metal plate electrodes clockwise. One of routes through which the metal wire 12 extends is a route 15a-14a-14k-15k. Below are listed the rest of the routes:

15b-14b-14l-15l;
15c-14c-14m-15m;
15d-14d-14n-15n;
15e-14e-14o-15o;
15f-14f-14p-15p;
15g-14g-14q-15q;
15h-14h-14r-15r;
15i-14i-14s-15s; and
15j-14j-14t-15t.

In the present preferred embodiment, Au is used as the metal wire 12. Therefore, when the interposer substrate is connected to the semiconductor device or the mother board by means of solder, the used material seeps into the melted solder. In order to solve the problem, barrier metal such as Ni or Cr is preferably formed on the electrodes the electroless plating.

The interposer substrate thus obtained is approximately 20-micron-pitched, far more fine-pitched than any conventional interposer substrate. The interposer substrate, when used in electronic devices, can greatly contribute to the miniaturization of the electronic devices.

Preferred Embodiment 2

A preferred embodiment 2 of the present invention is described referring to FIGS. 3A-3F. In the description below, the structural components and the constitutions already described in the preferred embodiment 1 will not be described again. First, a metal plate 21, which is an example of a block, is prepared. On the metal plate 21, a projection 24 projecting in a thickness direction thereof and constituting a filler member is formed in advance. The metal plate 21 is made of, for example, aluminum (Al). The metal plate 21 provided with the projection may be separate metal blocks bonded to each other, or the projection 24 may be formed on the metal plate 21 when the metal plate 21 is formed. A discretionary point on a principal surface 21a of the metal plate 21 and a discretionary point on the upper surface 24a of the projection 24 are coupled to each other with a metal wire 22 having a length larger than a distance between the two discretionary points and having a bow-like shape or any other curved shape by an all-purpose wire boding device. It is preferable that the metal wire 22 is ball-bonded to the principal surface 21a, and then stitch-bonded to the upper surface 24a of the projection 24. The metal wire 22 is thus bonded because the wire diameter at the bonding section is large when the metal wire 22 is ball-bonded to the principal surface 21a and can be directly used as the land for the wide-pitched mother board (see FIG. 3A).

Accordingly, a shape 22a called ball bond is formed at one end of the metal wire 22, while a shape 22b called stitch bond is formed at the other end thereof. The metal wire 22 is coupled to the metal plate 21 and the projection 24 via the shapes 22a and 22b.

Next, liquid resin is applied to the principal surface 21a of the metal plate 21 by a dispenser to such an extent that the metal wire 22 is dipped therein. The applied liquid resin is, for example, heated at 150° C. for one hour to be cured, so that a resin-cured material 23 is obtained (see FIG. 3B).

After the resin is cured, the upper-surface portion of the resin-cured material 23 is polished. More specifically, a SiC sand paper having appropriate particle sizes (not shown) is prepared, and the upper-surface portion of the resin-cured material 23 is thereby polished to be removed so that the upper surface 23a of the resin-cured material 23 will be in parallel with the metal plate 21. The resin-cured material 23 is removed until the upper surface 24a of the projection 24 is exposed. In the polishing process, an end portion 22c of the metal wire 22 having a bow-like shape or any other curved shape is removed together with the upper-surface portion of the resin-cured material 23 (see FIG. 1C).

When the end portion 22c of the metal wire 22 is removed, a wire portion 22d at the other end of the metal wire 2 remains in the post-polishing resin-cured material 23. The ball bond shape 22a is located at one end of the wire portion 22d (at the end portion on the side of the metal plate 21). The other end 22b of the wire portion 22d is exposed out of a polished surface 23a' of the resin-cured material 23. Hereinafter, the polished surface 23a' of the resin-cured material 23 is referred to as one principal surface 23a' of the resin-cured material 23.

After that, the metal plate 21 (not including the projection 24) is removed from the resin-cured material 23 according to a method similar to that of the preferred embodiment 1. Accordingly, the one end of the wire portion 22d on the other principal surface 23b of the resin-cured material 23 (where the ball bond shape 22a is provided) is exposed out of the resin-cured material 23, and a lower surface 24b of the projection 24 is exposed out of the resin-cured material 23. As a result of these steps, an interposer substrate can be obtained (see FIGS. 3D-3F).

In the present preferred embodiment, the projection 24 is provided in the resin-cured material 23 so as to penetrate therethrough in a thickness direction thereof, and the upper and lower surfaces 24a and 24b of the projection 24 are exposed out of the resin-cured material 23. As a result, the projection 24 can be used as a heat-release path. Thus, an interposer substrate having a high heat releasability can be obtained. When the projection 24 is used not only for heat release but also, for example, as a ground, a semiconductor package having a high electric stability wherein a reference potential is stabilized can be provided. Further, the projection 24 can be used as a power supply, in which case an effect similar to the effect obtained when the projection 24 is used as the ground can be obtained. However, when the projection 24 is used as the ground or power supply, it is necessary to connect the upper surface 24a of the projection 24 (on which the semiconductor device is mounted) to power supply or ground pins of the semiconductor device. After that, the connection and land electrodes are formed and aligned on an as needed basis by, for example, electroless plating, electroplating, etching and the like.

In the present preferred embodiment, when the shape of the projection 24 is changed, the land electrode for mounting the mother board can be provided at any discretionary position, which is described referring to FIGS. 4A-4D. In a constitution illustrated in FIG. 4A, a plurality of projections 24C and 24B are provided on the principal surface 21a of the metal plate 21. A first metal wire 22c is provided so as to extend from the upper surface 21a of the metal plate 21 to the upper surface 24Ca of the projection 24C, while a second metal wire 22B is provided so as to extend from the upper surface 21a to the upper surface 24Ba of the projection 24B. The first and second metal wires 22C and 22B are ball-bonded to the principal surface 21a, and then stitch-bonded to the upper surfaces 24Ca and 24Ba of the projections 24C and 24B. It appears in the drawing that the first metal wiring 22C and the second metal wire 22B intersect; however, they are actually apart in a depth direction of the drawing.

Ball bonding shapes 25 of the first and second metal wires 22B and 22C provided on the principal surface 21a serve as land electrodes as a result of the subsequent steps. A formation pitch of the ball bonding shape 25 is arbitrarily set depending on a layout pitch of the land electrode.

After the processing described so far, liquid resin is applied to the upper surface 21a of the metal plate 21 and then cured, the resin-cured material 23 thereby obtained is polished, and the metal plate 21 (not including the projections 22C and 22B) is removed. As a result, an interposer substrate provided with the ball bonding shapes 25 (land electrodes) illustrated in FIGS. 4B-4D can be obtained. A layout pitch of the land electrode 25 of the interposer substrate can be set to either fan-in or fan-out depending on the formation pitch of the ball bonding shape. A reference symbol 22Cd in the drawing denotes the first metal wire still remaining after the resin-cured material 23 is polished, while a reference symbol Bd denotes the second metal wire still remaining after the resin-cured material 23 is polished. A reference symbol 25 (22Cd) denotes a land electrode connected to the first metal wire 22Cd, while 25 (Bd) denotes a land electrode connected to the second metal wire Bd.

Figure 5A:
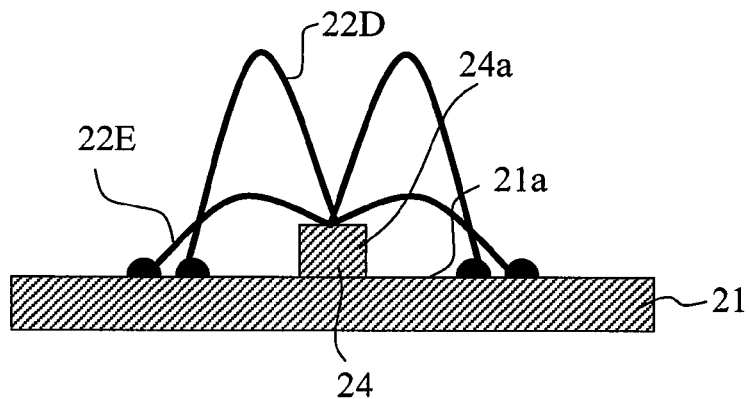
FIGS. 5A-5B are sectional views respectively illustrating an interposer substrate manufacturing process according to a modified embodiment (2) of the preferred embodiment 2.
Figure 5B:
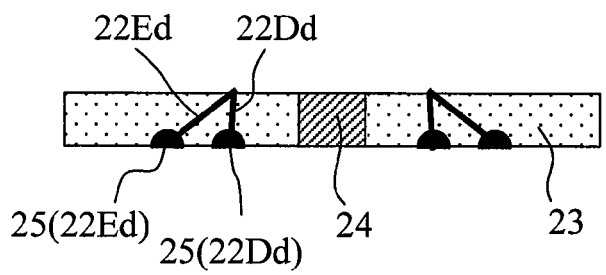
Figure 5C:
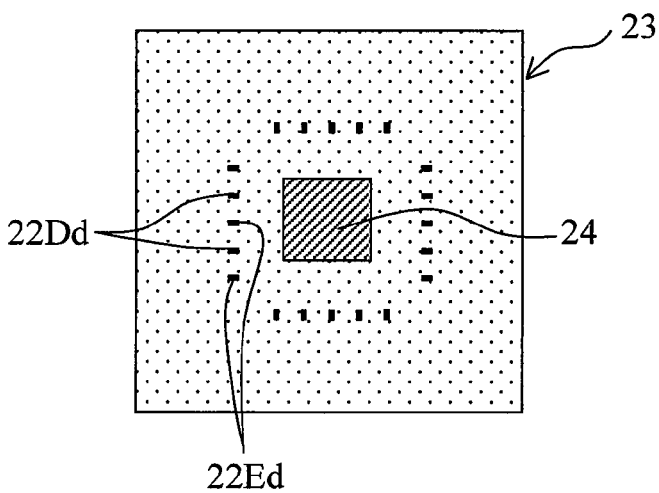
FIG. 5C is a plan view of an interposer substrate manufactured in the manufacturing process according to the modified embodiment (2) of the preferred embodiment 2.
Figure 5D:
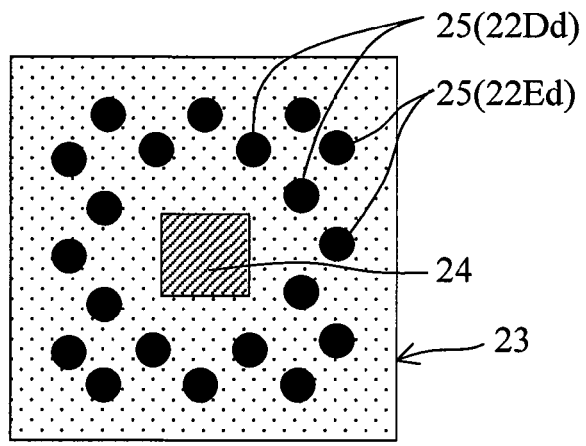
FIG. 5D is a bottom view of the interposer substrate manufactured in the manufacturing process according to the modified embodiment (2) of the preferred embodiment 2.

When loop shapes of the metal wires 22 are variously adjusted, the land electrodes can be formed at any discretionary positions. Below is given a description referring to FIGS. 5A-5D. In a constitution illustrated in FIG. 5A, first and second metal wires 22D and 22E respectively having different loop shapes (shapes having different lengths) are provided so as to extend from the principal surface 21a of the metal plate 21 comprising the projection 24 to the upper surface 24a of the projection 24. The first metal wire 22D is long and has an acutely bent shape. The second metal wire 22E is short and has a moderately bent shape. It appears in the drawing that the first metal wire 22D and the second metal wire 22E intersect; however, they are actually apart in a depth direction of the drawing. A reference symbol 22Dd denotes the first metal wire still remaining after the resin-cured material 23 is polished, and a reference symbol 22Ed denotes the second metal wire still remaining after the resin-cured material 23 is polished. A reference symbol 25 (22Dd) denotes a land electrode connected to the first metal wire 22Dd, while a reference symbol 25 (22Ed) denotes a land electrode connected to the second metal wire 22Ed.

The metal wires 22D and 22E having the described shapes are provided, and liquid resin is applied to the metal plate 21 so as to cover the metal wires 22D and 22E and then cured. After that, the upper-surface portion of the resin-cured material 23 thereby obtained is polished, and the metal plate 21 (not including the projection 24) is removed from the resin-cured material 23. As a result, an interposer substrate illustrated in FIGS. 5B-5D can be obtained. Thus, the land electrode 25 can be formed at any discretionary position as far as the position is on an outer side than the connection electrode for mounting the semiconductor device. When the method described referring to FIGS. 4A-4D and FIG. 5A-5D is adopted, the land electrodes for mounting the mother board can be provided at any discretionary positions of the interposer substrate.

The interposer substrate thus obtained exerts, in addition to the effects described in the preferred embodiment 1, the following effects.

Metal having a high thermal conductivity (Al or the like) can constitute the projection (filler member) 24 embedded in the resin-cured material 23. Therefore, heat generated in the semiconductor device can be efficiently transferred to the mother board.

When the projection (filler member) 24 is used as a ground, a reference potential is stabilized, and high electric stability can be obtained.

The entire body of the projection (filler member) 24 is made of metal; however, a similar effect can be exerted as far as at least the surface thereof is made of metal.

Preferred Embodiment 3

A preferred embodiment 3 of the present invention is described referring to FIGS. 6A-6F. In the description below, the structural components and the constitutions already described in the preferred embodiments 1 and 2 will not be described again. First, a metal plate 31, which is an example of a block, is prepared. A projection 34 provided with a step portion 34a in advance in a plate-thickness direction is formed on a principal surface 31a of the metal plate 31. The projection 34, which is provided with the step portion 34a, comprises an uppermost surface 34b and an upper surfaces 34c of the step portion. The metal plate 21 is made of, for example, aluminum (Al). The uppermost surface 34b and the upper surfaces 34c of the step portions of the projection 34 on the metal plate 31 are coupled to each other, and the uppermost surface 34b and a discretionary point of the principal surface 31a of the metal plate 31 are coupled to each other with metal wires 32 having a bow-like shape or any other curved shape by an all-purpose wire boding device (see FIG. 6A). It appears in the drawing that the metal wires 32 intersect; however, they are actually apart in a depth direction of the drawing.

Next, liquid resin is applied to the principal surface 31b of the metal plate 31 by a dispenser to such an extent that the metal wires 32 are dipped therein. The applied liquid resin is, for example, heated at 150° C. for one hour to be cured, so that a resin-cured material 33 is obtained (see FIG. 6B).

After the resin is cured, the upper-surface portion of the resin-cured material 33 is polished. More specifically, the upper-surface portion of the resin-cured material 33 is polished to be removed so that the upper surface 33a of the resin-cured material 33 will be in parallel with the principal surface 31a of the metal plate 31 (see FIG. 6C).

The resin-cured material 33 is polished until the uppermost surface 34b of the projection 34 is exposed. In the polishing process, one-end portions 32c of the metal wires 32 are removed together with the upper-surface portion of the resin-cured material 33. When the one-end portions 32c of the metal wires 32 are removed, a wire portion 32d at the other end of the metal wire 32 remains in the post-polishing resin-cured material 33. A ball bond shape 32a is located at one end of the wire portion 32d (end portion on the side of the metal plate 31). The other end 32b of the wire portion 32d is exposed out of a polished surface (one principal surface) 33a' of the resin-cured material 33. The ball bond shape 32a serves as a land electrode for mounting a mother board, while the other end 32b of the wire portion 32d serves as a connection electrode for mounting a semiconductor device. Of a plurality of ball bond shapes 32a, the ball bond shape 32a exposed out of the other principal surface 33b of the resin-cured material 33 serves as a land electrode for receiving and transmitting a signal with respect to the mother board. Some of the plurality of ball bond shapes 32a abut the upper surfaces 34c of the step portions and are thereby connected to the projection 34. Since the ball bond shapes 32a are thus connected thereto, the projection 34 can serve as a land electrode for a power supply or ground of the semiconductor device. It is important to provide the step portions 32a in the projection 34 when the ball bond shapes 32a are provided on the projection 34. In the present preferred embodiment, because of the presence of the step portions 34a, the ball bond shapes 32a can be formed in the projection 34 by the all-purpose wire bonding device.

Figure 6A:
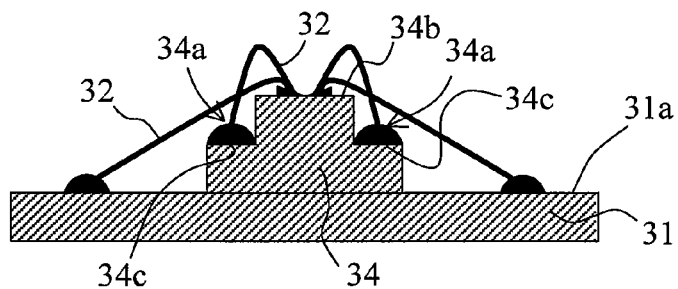
FIGS. 6A-6D are sectional views respectively illustrating an interposer substrate manufacturing process according to a preferred embodiment 3 of the present invention.
Figure 6B:
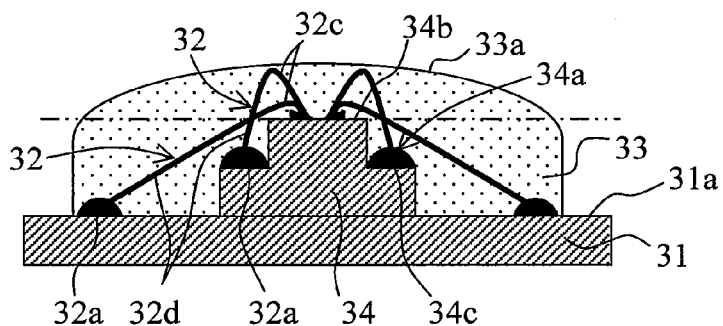
Figure 6C:
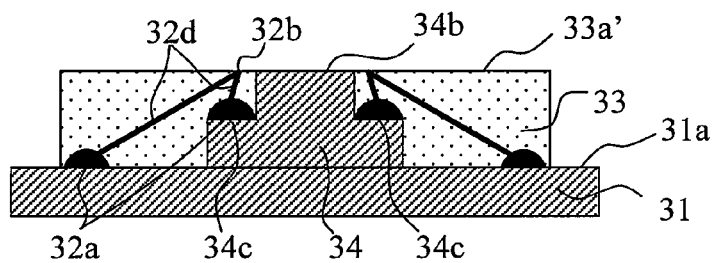
Figure 6D:
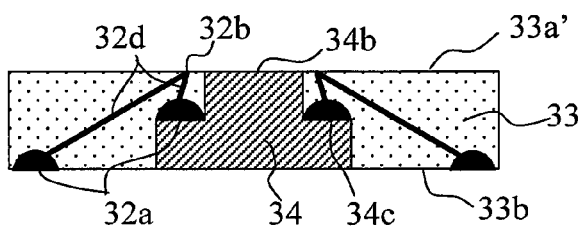
Figure 6E:
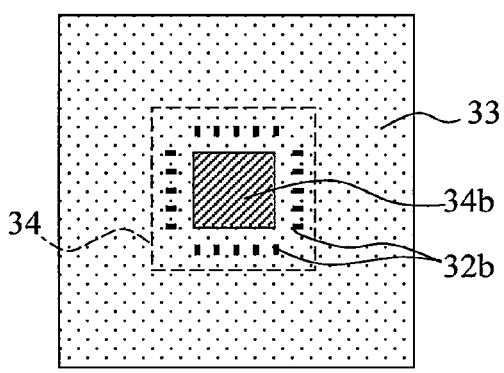
FIG. 6E is a plan view of an interposer substrate manufactured in the manufacturing process according to the preferred embodiment 3.
Figure 6F:
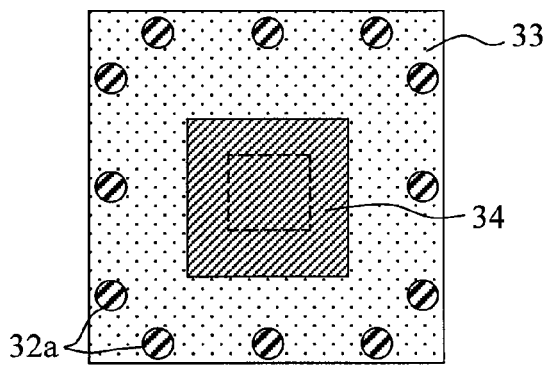
FIG. 6F is a bottom view of the interposer substrate manufactured in the manufacturing process according to the preferred embodiment 3.

Then, the metal plate 31 (not including the projection 34) is removed from the resin-cured material 33 according to a method similar to that of the preferred embodiments 1 and 2, and an interpose substrate can be obtained (see FIGS. 6D-6F).

The interposer substrate thus obtained exerts, in addition to the effects described in the preferred embodiments 1 and 2, the following effects.

Since the power supply or ground can be intensively provided on the projection 34 on the interposer substrate, the number of pins can be reduced when the semiconductor device is packaged. Accordingly, a level of designing difficulty is significantly lessened, which reduces a designing period.

Preferred Embodiment 4

A preferred embodiment 4 of the present invention is an application of the preferred embodiment 3. According to the present preferred embodiment, an interposer provided with a capacitor therein can be manufactured. Below is given a description referring to FIGS. 7A-7E, wherein the structural components and the constitutions already described in the preferred embodiments 1-3 will not be repeatedly described.

Figure 7A:
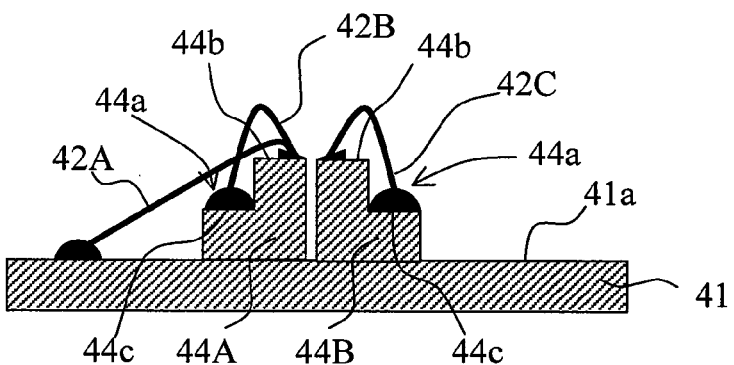
FIGS. 7A-7C are sectional views respectively illustrating an interposer substrate manufacturing process according to a preferred embodiment 4 of the present invention.
Figure 7B:
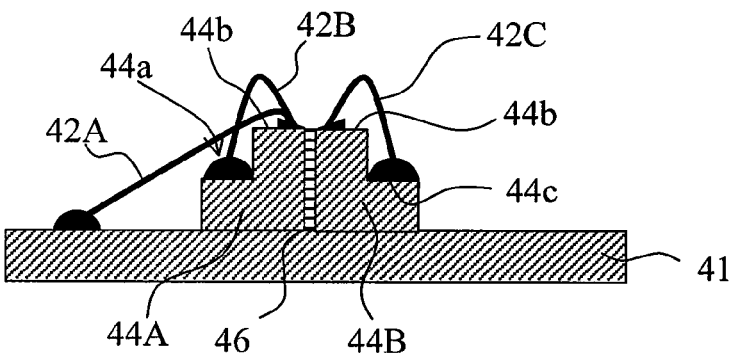

As illustrated in FIG. 7A, first, a metal plate 41, which is an example of a block, is prepared. On the metal plate 41, first and second projections 44A and 44B each having a step portion 44a are formed in advance in a plate-thickness direction. The first and second projections 44A and 44B respectively have a side surface on which the step portion 44a is formed, and a side surface opposite thereto on which the step portion 44a is not formed. The first and second projections 44A and 44B are provided with each side surface on which the step portion 44a is not formed facing each other with a distance therebetween; however, they are placed as close to each other as possible.

Next, a discretionary point on the uppermost surface 44b of the first projection 44A and a discretionary point on a principal surface 41a of the metal plate 41 are coupled to each other with a metal wire 42A; a discretionary point on the uppermost surface 44b of the first projection 44A and the upper surface 44c of the step portion of the first projection 44A are coupled to each other with a metal wire 42B; and a discretionary point on the uppermost surface 44b of the second projection 44B and the upper surface 44c of the step portion of the second projection 44B are coupled to each other with a metal wire 42C (see FIG. 6A).

In these coupling processes, an all-purpose wire bonding device is used. It appears in the drawing that the metal wire 42A and the metal wire 42B intersect; however, they are actually apart in a depth direction of the drawing.

The first projection 44A is connected to a power supply pin of a semiconductor device through the metal wire 42B as a result of the processing described later, while the second projection 44B is connected to a ground pin of the semiconductor device through the metal wire 42C as a result of the processing described later.

A dielectric paste is applied to the gap between the first projection 44A and the second projection 44B and heated at 150° C. for approximately one hour to be cured, so that a dielectric layer 46 is formed. As the dielectric paste is used, for example, epoxy resin in which titanic acid barium particles are dispersed (see FIG. 7B).

Next, liquid resin is applied to the metal plate 41 so as to cover the metal wires 42A, 42B and 42C and thereafter cured. Then, the resin-cured material 43 thereby obtained is polished, and the metal plate 41 (not including the projections 44) is removed. The description of these polishing and removal processes, which are similar to those described in the preferred embodiments 1 and 2, is omitted.

Figure 7C:
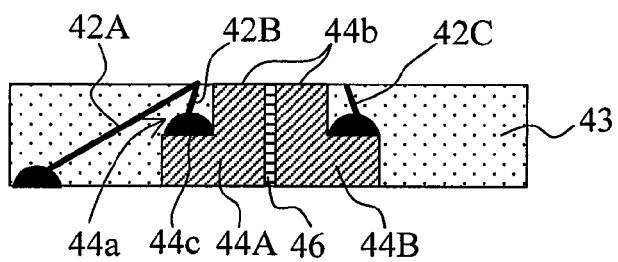
Figure 7D:
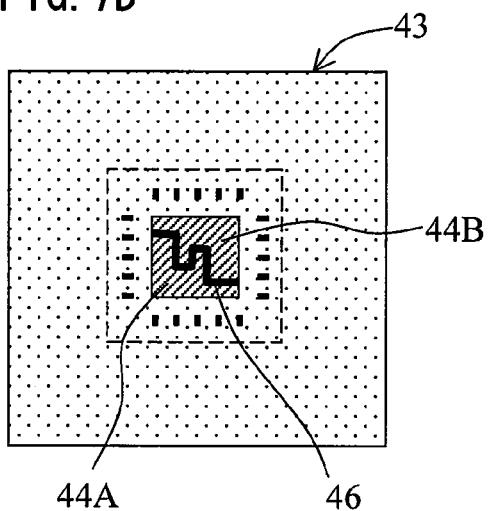
FIG. 7D is a plan view of an interposer substrate manufactured in the manufacturing process according to the preferred embodiment 4.
Figure 7E:
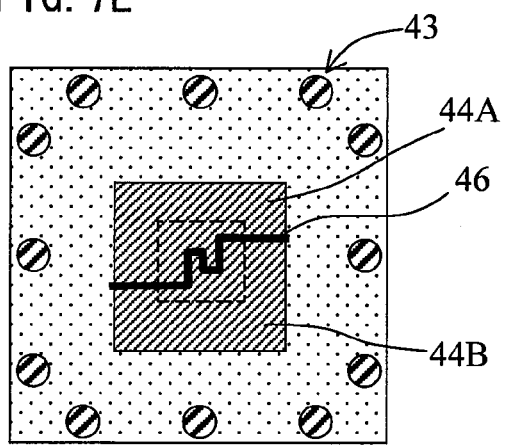
FIG. 7E is a bottom view of the interposer substrate manufactured in the manufacturing process according to the preferred embodiment 4.

Thus processed, an interposer substrate illustrated in FIG. 7C-7E can be obtained. The first projection 44A, dielectric layer 46 and second projection 44B constitute a capacitor. In order to increase a capacity volume of the capacitor, it is preferable to increase surface areas of the side surfaces of the first and second projections 44A and 44B between which the dielectric layer 46 is interposed. In order to increase the surface areas, for example, the surfaces may be polished to be roughened, or anodic oxidation adopted in an aluminum electrolytic capacitor or the like may be performed. When the anodic oxidation is performed, an alternate current is applied using the metal plate 41 as a feeder layer, and the side surfaces of the first and second projections 44A and 44B are electrolytically etched in an electrolytic solution containing hydrochloric acid as a main ingredient thereof to be thereby roughened. Then, a voltage is applied to the metal plate 41 (feeder layer) in a neutral electrolytic solution, so that the side surfaces of the first and second projections 44A and 44B are anodically oxidized. This anodic oxidation further roughens the side surfaces of the first and second projections 44A and 44B, and forms an oxide film on these side surfaces. The applied voltage is, for example, approximately 30-100 V, and a film thickness of the formed oxide film is, for example, approximately 20-120 nm.

Figure 8A:
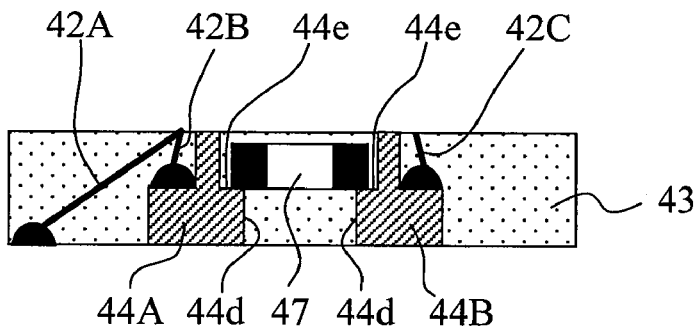
FIG. 8A is a sectional view of an interposer substrate manufactured in a manufacturing process according to a modified embodiment of the preferred embodiment 4.
Figure 8B:
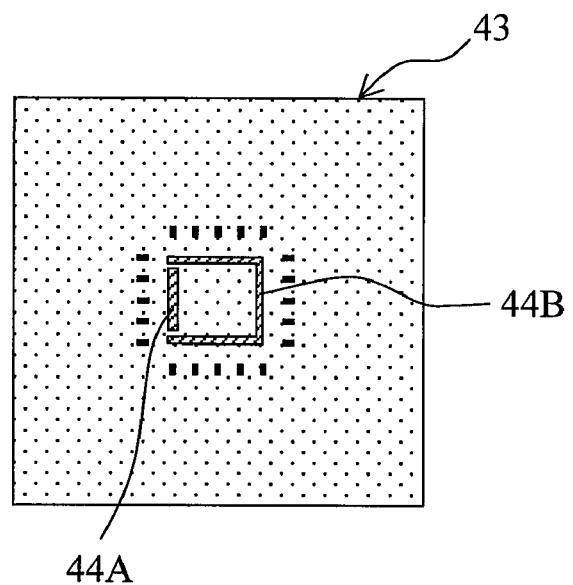
FIG. 8B is a plan view of the interposer substrate manufactured in the manufacturing process according to the modified embodiment of the preferred embodiment 4.
Figure 8C:
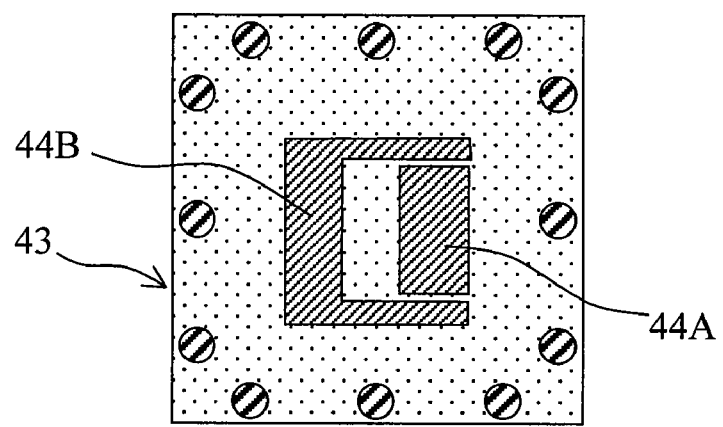
FIG. 8C is a bottom view of the interposer substrate manufactured in the manufacturing process according to the modified embodiment of the preferred embodiment 4.
Figure 9:
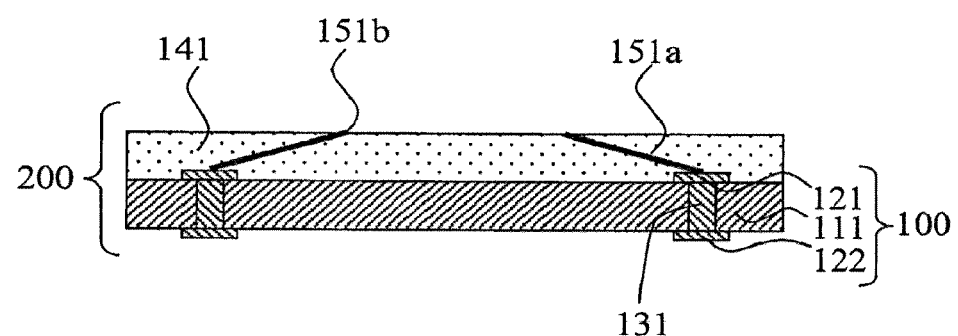
FIG. 9 is a sectional view of a conventional interposer substrate.

In place of providing the dielectric layer 46, engaging step portions 44e and 44e are respectively formed on the side surfaces 44d and 44d of the first and second projections 44A and 44B facing each other, and a chip capacitor 47 is placed between the engaging step portions 44e and 44e as illustrated in FIGS. 8A-8C. A depth of the engaging step portions 44e and 44e is set to be larger than a height of the chip capacitor 47. Accordingly, the chip capacitor 47 is housed therein without protruding upward from the engaging step portions 44e and 44e. The chip capacitor 47 is connected to the first and second projections 44A and 44B at bottom portions of the engaging step portions 44e and 44e.

Next, liquid resin is applied to the metal plate (not shown) so as to cover the metal wires 42A, 42B and 42C and the chip capacitor 47 and thereafter cured. Then, a resin-cured material 43 thereby obtained is polished, and the metal plate (not including the projections 44A and 44B) is removed.

As a result, the chip capacitor 47 can be used as a bypass capacitor. A bonding material used when the chip capacitor 47 is mounted on the first projection 44A and the second projection 44B may be solder or a conducive paste in which metal such as Ag is dispersed. It is, however, necessary to previously form a resist film on the metal plate 41 when solder is used.

The interposer substrate thus obtained has the effect of removing high electromagnetic noise in addition to the effects described earlier.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An interposer substrate comprising:
a resin-cured material having a plate shape; and
a metal wire provided in the resin-cured material so as to penetrate the resin-cured material in its thickness direction,
wherein an end of the metal wire exposed out of one surface of the resin-cured material is used as a connection electrode for mounting a semiconductor substrate thereon, and the other end of the metal wire exposed out of another surface of the resin-cured material is used as a land electrode for connecting a mother board thereto, and
a filler member is provided in the resin-cured material so as to penetrate the resin-cured material in its thickness direction, and the entire body of the filler member is made of metal.

2. The interposer substrate as claimed in claim 1, wherein the filler member comprises a step portion on its surface side exposed out of the one surface of the resin-cured material, and
a plurality of the metal wires are provided, the other end of at least one of the plurality of the metal wires is coupled to the step portion, and the filler member serves as the land electrode.

3. The interposer substrate as claimed in claim 2, further comprising a pair of the filler members provided close to each other,
wherein the gap between the pair of the filler members is filled with a dielectric member.

4. The interposer substrate as claimed in claim 2, further comprising a pair of the filler members, wherein a chip-type electronic component is mounted between the pair of the filler members.

5. The interposer substrate as claimed in claim 1, wherein the land electrode has a ball bond shape.

6. The interposer substrate as claimed in claim 1, wherein a metal plate electrode abutting an end or the other end of the metal wire and thereby connected thereto is provided on at least either one or the other surface of the resin-cured material, and the metal plate electrode constitutes the connection electrode or the land electrode.

7. The interposer substrate as claimed in claim 1, wherein the metal is aluminum.

* * * * *